US009393591B2

(12) United States Patent
Aldakov et al.

(10) Patent No.: US 9,393,591 B2
(45) Date of Patent: Jul. 19, 2016

(54) METHOD FOR DEPOSITING NANOPARTICLES ON A NANOSTRUCTURED METAL OXIDE SUBSTRATE

(71) Applicant: COMMISSARIAT A L'ENERGIE ATOMIQUE ET AUX ENE ALT, Paris (FR)

(72) Inventors: Dimitry Aldakov, Grenoble (FR); Valentina Ivanova-Hristova, Grenoble (FR); Peter Reiss, Saint Egreve (FR); Sylvia Sanchez, Vaulnaveys le Haut (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 25 days.

(21) Appl. No.: 14/396,948

(22) PCT Filed: Apr. 23, 2013

(86) PCT No.: PCT/EP2013/058365
§ 371 (c)(1),
(2) Date: Oct. 24, 2014

(87) PCT Pub. No.: WO2013/160285
PCT Pub. Date: Oct. 31, 2013

(65) Prior Publication Data
US 2015/0111339 A1    Apr. 23, 2015

(30) Foreign Application Priority Data

Apr. 26, 2012  (FR) ..................... 12 53825

(51) Int. Cl.
B05D 1/36      (2006.01)
B05D 3/00      (2006.01)
(Continued)

(52) U.S. Cl.
CPC  B05D 1/36 (2013.01); B05D 3/002 (2013.01); H01L 51/0003 (2013.01); H01L 51/4233 (2013.01); B05D 1/38 (2013.01); H01L 51/4226 (2013.01); Y02E 10/549 (2013.01)

(58) Field of Classification Search
None
See application file for complete search history.

(56) References Cited

U.S. PATENT DOCUMENTS

2009/0104435 A1* 4/2009 Hutchison ............. B82Y 10/00
                                                     428/328
2009/0159120 A1* 6/2009 Wang .................... B82Y 20/00
                                                     136/252

(Continued)

OTHER PUBLICATIONS

International Search Report issued Nov. 22, 2013, in PCT/EP2013/058365, filed Apr. 23, 2013.

(Continued)

Primary Examiner — Michael P Rodriguez
(74) Attorney, Agent, or Firm — Oblon, McClelland, Maier & Neustadt, L.L.P

(57) ABSTRACT

The present invention relates to a method for depositing nanoparticles (NPs) on a nanostructured metal oxide (NSMO) substrate, characterized in that it comprises the steps of:
a) functionalizing the NSMO substrate with a bifunctional coupling agent carrying a first function, this first function being a phosphonic function that forms a bond with the NSMO, and a second function that is intended to form a bond with a nanoparticle; and
b) grafting the nanoparticles via a bond with the second function of the coupling agent.

The invention also relates to a stack comprising a nanostructured metal oxide substrate covered with nanoparticles by way of a bifunctional coupling agent carrying a first function, this first function being a phosphonic function and forming a bond with the NSMO, and a second function that is intended to form a bond with a nanoparticle.

The invention is applicable to the field of microelectronics and especially to the production of electrodes and the production of photovoltaic panels.

20 Claims, 4 Drawing Sheets

(51) Int. Cl.
　　　*H01L 51/00*　　(2006.01)
　　　*B05D 1/38*　　(2006.01)
　　　*H01L 51/42*　　(2006.01)

(56) References Cited

U.S. PATENT DOCUMENTS

2009/0211634 A1* 8/2009 Serban .................. B82Y 20/00
　　　　　　　　　　　　　　　　　　　136/256
2009/0267479 A1* 10/2009 Hutchison ............... H01J 1/304
　　　　　　　　　　　　　　　　　　　313/309

OTHER PUBLICATIONS

Pendar Ardalan, et al., "Phosphonate Self-Assembled Monolayers as Organic Linkers in Solid-State Quantum Dot Sensetized Solar Cells", 35th IEEE Photovoltaic Specialists Conference, XP 031784336, Jun. 20, 2010, pp. 951-954.

Craig L. Perkins, "Molecular Anchors for Self-Assembled Monolayers on ZnO: A Direct Comparison of the Thiol and Phosphonic Acid Moieties", Journal of Physical Chemistry C, vol. 113, No. 42, XP 055049004, 2009, pp. 18276-18286.

Susanne Krüger, et al., "Study of the Attachment of Linker Molecules and Their Effects on the Charge Carrier Transfer at Lead Sulfide Nanoparticle Sensitized ZnO Substrates", The Journal of Physical Chemistry C, vol. 115, No. 26, XP 055048979, Jul. 7, 2011, pp. 13047-13055.

Tsung-Wei Zeng, et al., "Effects of bifunctional linker on the optical properties of ZnO nanocolumn-linker-CdSe quantum dots heterostructure", Journal of Colloid and Interface Science, vol. 358, No. 2, XP 028197831, Mar. 2011, pp. 323-328.

K. Vijaya Sarathy, et al., "Superlattices of Metal and Metal-Semiconductor Quantum Dots Obtained by Layer-by-Layer Deposition of Nanoparticle Arrays", Journal of Physical Chemistry B, vol. 103, No. 3, XP 000858368, Jan. 1999, pp. 399-401.

Kuan-Ting Kuo, et al., "Core-shell $CuInS_2$/ZnS quantum dots assembled on short ZnO nanowires with enhanced photo-conversion efficiency", Journal of Materials Chemistry, vol. 19, 2009, pp. 6780-6788.

Sara A. Dibenedetto, et al., "Molecular Self-Assembled Monolayers and Multilayers for Organic and Unconventional Inorganic Thin-Film Transistor Applications", Advanced Materials, vol. 21, 2009, pp. 1407-1433.

Tammy P. Chou, et al., "Effects of Dye Loading Conditions on the Energy Conversion Efficiency of ZnO and $TiO_2$ Dye-Sensitized Solar Cells", J. Phys. Chem. C., vol. 111, No. 50, 2007, pp. 18804-18811.

Jin Young Kim, et al., "ZnO—CdSe Nanoparticle Clusters as Directional Photoemitters with Tunable Wavelength", J. Am. Chem. Soc., vol. 127, No. 29, 2005, pp. 10152-10153.

Tsung-Wei Zeng, et al., "Effects of bifunctional linker on the performance of P3HT/CdSe quantum dot-linker-ZnO nanocolumn photovoltaic device", Optics Express, vol. 18, No. S3, Sep. 13, 2010, pp. A357-A365.

Wei Gao, et al., "Self-Assembled Monolayers of Alkylphosphonic Acids on Metal Oxides", Langmuir, vol. 12, No. 26, 1996, pp. 6429-6435.

Rachel S. Dibbell, et al., "Distance-Dependent Electron Transfer in Tethered Assemblies of CdS Quantum Dots and $TiO_2$ Nanoparticles", J. Phys. Chem. C., vol. 113, No. 8, 2009, pp. 3139-3149.

Matthew G. Panthani, et al., "Synthesis of $CuInS_2$, $CuInSe_2$, and $Cu(In_xGa_{1-x})Se_2$ (CIGS) Nanocrystal "Inks" for Printable Photovoltaics", J. Am. Chem. Soc., vol. 130, No. 49, 2008, pp. 16770-16777.

* cited by examiner

METHOD FOR DEPOSITING NANOPARTICLES ON A NANOSTRUCTURED METAL OXIDE SUBSTRATE

TECHNICAL FIELD

The present invention relates to a method for depositing nanoparticles on a nanostructured metal oxide (NSMO) and a stack obtained by said method.

The nanostructured metal oxides (NSMOs) can be used as electrodes for (opto-) electronic devices. They offer a versatile and efficient approach to "bottom-up" assembling. Besides, they have a high potential for integrating organic electronics with inorganic materials-based electronics thanks to their easy synthesis, their very good crystallinity and their high conductivity which give them good properties as electrons acceptor. Many applications require such nanostructures to be covered by nanocrystals (NCx) or more generally nanoparticles (NPs), more particularly for the production of sensitized solar cells with quantum dots (Quantum Dot Sensitized Solar Cells or QDSSC), photodetectors, light emitting diodes (LEDs), directional photo-emitting devices or memories. For these applications, the nanocrystals are for instance used as light absorbers or emitters, or capacitance. The method for depositing nanocrystals on nanostructures has a crucial effect on the behaviour of the final device, and the effectiveness and the cost thereof.

The present invention relates to the treatment of the surface of the NSMOs which makes the deposition of the NPs fast and efficient.

STATE OF THE ART

The deposition of the NPs on the NSMOs can be performed using several methods:
- Growing the NPs directly on the oxide using the "chemical bath deposition" (or CBD) procedure,
- Adsorption and reaction of the successive ionic layers ("successive ion layer adsorption and reaction" or SILAR).

The deposition of the NPs using the CBD method is relatively simple and consists in soaking the substrates in the solution which contains all the NPs precursors in the form of salts. This production is slow with little control on the size, the size distribution and the surface of the NPs.

The SILAR shows a modification of the CBD and consists in consecutively soaking the NSMOs in the solutions of cationic and anionic precursors. This method is more efficient than CBD as regards the selection of precursors and a little better for the control of the NPs in general but it also suffers the disadvantages listed above.

These problems can be avoided when synthesizing the NPs ex situ. In the case of physisorption—currently the most popular method for producing devices—the nanostructured electrode is impregnated with a solution of pre-synthesized NPs. In this case it is difficult to control the density and the thickness of the particles on the surface of the nanostructured electrode. More particularly, the surface coating is often low and deposit inhomogeneities are commonly observed, depending on the morphology of the metal oxide nanostructures used. The assembling of the NPs using this method strongly depends on the deposition conditions and on the surface condition of the NSMOs.

Today the best control of the deposition of NPs on the NSMO is achieved using bifunctional coupling agents [Watson, D. F. J. Phys. Chem. Lett. 2010, 1, 2299-2309.]. This approach allows a priori a perfect control of the size, shape and composition of the NPs because they are produced ex situ. The principle of the method is as follows: a chemical group of the coupling agent is grafted to the surface of the nanoparticles, which allows them to bind to the NSMOs through another group of the coupling agent. The NPs are functionalized with the bifunctional coupling agent, and they are assembled on the surface of the NSMOs. This exchange of ligands on the surface of the NPs generally generates surface defects which may act as trap conditions for charge carriers and thus affect the performances of a device incorporating the produced NSMO. Another drawback of the exchange of ligands is that it may reduce the colloidal stability of the NPs and induce the precipitation thereof. Another problem arising during the deposition of the NPs on the NSMOs consists in providing the most uniform coating possible for the most efficient use of excitons or charge carriers. A final problem that often arises concerns the deposition technical procedures. Depositing NPs often requires expensive and/or sophisticated equipment with which the deposition time is long, which complicates the production of devices.

The Publication by Tsung-Wei Zeng et al entitled "Effects of bifunctional linker on the optical properties of ZnO nano-column-linker-CdSe Quantum dots heterostructure" and published in the Journal of COLOID and Interface Science (358-2011-323-328) discloses a method of linking a for example zinc oxide (ZnO) nanocolumn and nanoparticles of the quantum dots type. According to this document, a link is first created between the nanocolumn and a linker. Then, the nanoparticles are coupled to the linker. Zinc oxide has advantages for some applications because of the electronic mobility and the life time of electrons that are high when compared to for example titanium dioxide (TI02). However, zinc oxide is fragile, too and therefore obstacles exist to using it in the form of nanostructures. There is clearly a need to improve the use of zinc oxide as a NSMO base material.

We are trying to find a way to eliminate all or part of the above-mentioned drawbacks.

DISCLOSURE OF THE INVENTION

The present invention relates to a method for depositing nanoparticles on a nanostructured metal oxide (NSMO) substrate, which comprises the steps of:
a) functionalising the NSMO substrate with a bifunctional coupling agent carrying a first function, this first function being a phosphonic function and forming a bond with the NSMO, and a second function that is intended to form a bond with a nanoparticle; and
b) grafting the nanoparticles via a bond with the second function of the coupling agent.

Functionalizing the nanostructured metal oxide (NSMO) with the coupling agent prior to grafting the nanoparticles (NPs) makes it possible to avoid the step of exchanging the ligands which may i) damage the colloidal stability of the NPs and induce the precipitation thereof, ii) generate trap conditions for charge carriers on the surface of the NPs.

The dispersion in size, shape, composition and surface condition of the nanoparticles is controlled thanks to the ex situ synthesis thereof. The selection of a phosphonic acid as the first function of the coupling agent to form a bond with the nanostructured metal oxide (NSMO) improves the linking of the coupling agent with the nanostructured metal oxide (NSMO).

The material used as the nanostructured metal oxide is preferably zinc oxide (ZnO). It should be noted that ZnO is deemed very fragile and difficult to use in the form of nanostructures due to its chemical structure. And it is also easily damaged (corroded, etched and possibly dissolved) by solutions the acidity or alkalinity of which is too high. As a matter of fact, it was surprisingly found, thanks to the invention, that using phosphonic acid as the coupling agent with a zinc oxide NSMO gave very good results despite the strong acidity of this acid. This result is particularly unexpected since, according to the method of the invention, phosphonic acid is used for functionalizing zinc oxide prior to grafting nanoparticles, which places phosphonic acid under concentration conditions which would normally be considered as the worst to obtain satisfactory results i.e., without destroying the NSMO substrate. Thus, highly efficient coupling can be obtained with phosphonic acid used directly on the NSMO for functionalizing the latter, when acids having a lower acidity such as carboxylic acid cause damage to the zinc oxide NSMO.

In addition, the bifunctional coupling agent having a phosphonic function is compatible with the nanostructured surface of the metal oxide thanks to the bi- or tridentate grafting mode thereof via oxygen atoms.

According to another aspect, the invention relates to a stack comprising a nanostructured metal oxide substrate covered with nanoparticles characterized in that it comprises a bifunctional coupling agent carrying a first function which is a phosphonic acid, forming a bond with the nanostructured metal oxide, and a second function forming a bond with a nanoparticle.

Other embodiments of the invention also relate to any stack obtained using the method.

DETAILED DESCRIPTION OF SPECIFIC EMBODIMENTS

Before going into the details regarding the embodiments of the invention, in particular with reference to the drawings, cumulative or alternative but non-limiting preferred embodiments of the method are given, such as:

- steps a) and b) are wet operations;
- NPs are synthesized independently;
- step a) comprises soaking the NSMO in a solution of bifunctional coupling agent;
- soaking the NSMO lasts from 10 seconds to 24 hours, preferably from 1 minute to 6 hours, more specifically one hour;
- soaking is preceded and followed by rinsing with a solvent, for example ethanol and drying for example in argon flow;
- step b) comprises soaking the functionalized NSMO obtained after step a) in a solution of nanoparticles;
- soaking the functionalized NSMO lasts from 1 minute to 72 hours, more preferably from 1 hour to 48 hours, preferably 12 hours
- soaking the functionalized NSMO is followed by rinsing with a solvent, for instance chloroform and drying e.g. in argon flow;
- steps a) and b) are carried out at a temperature between 10° C. and 80° C., preferably between 18° C. and 25° C.;
- in step a), the bifunctional coupling agent is in solution in a suitable solvent, such as ethanol, dimethylsulfoxide or water.
- in step b) the NPs are in solution in a suitable solvent, for example chloroform, toluene, hexane or heptane.
- the coupling agent comprises a spacer between the first function and the second function;
- the spacer comprises a linear or branched saturated or unsaturated carbon chain, aliphatic by nature or aromatic by nature having 2 to 36 carbon atoms, the spacer may contain heteroatoms such as for example oxygen, sulphur or nitrogen, and the spacer may be of the non-conjugated type;
- the coupling agent may be selected for example among the mercaptoethylphosphonic acid (MEPA) and the mercaptoundecylphosphonic acid (MUPA);
- the nanoparticles are elementary, binary, ternary or multinary systems
- the nanoparticles are of the homogeneous composition type, alloy type, core/shell type or core/multiple shells type or may have a composition gradient.
- the nanostructured metal oxide is selected among zinc, titanium, tin, zirconium, tantalum, niobium or molybdenum, iridium, nickel or yttrium oxide
- the second function is selected among a phosphonic acid, phosphonic acid, phosphine, phosphine oxide, carboxylic acid, amine, imidazole, pyridine, thiol, dithiol, carbodithioate, dithiocarbamate, xanthate, sulfonate, sulfate, selenate or selenoate function.
- the method may comprise after step b) the successive steps of:
  - functionalizing the NPs grafted with the NSMO, using a second bifunctional coupling agent, so configured as to form a bond with the NPs bonded with the NSMO; and
  - grafting the NPs via a bond with the second coupling agent.

According to preferred cumulative or alternative, but non-limiting embodiments of the invention, the stack is such that:

- the coupling agent comprises a spacer between the first function and the second function;
- the spacer comprises a linear or branched saturated or unsaturated carbon chain, aliphatic by nature or aromatic by nature having 2 to 36 carbon atoms, the spacer may contain heteroatoms such as for example oxygen, sulphur or nitrogen;
- the coupling agent may be selected for example among the mercaptoethylphosphonic acid (MEPA) and the mercaptoundecylphosphonic acid (MUPA);
- the nanoparticles are elementary, binary, ternary or multinary systems
- the nanoparticles are of the homogeneous composition type, alloy type, core/shell type or core/multiple shells type or may have a composition gradient.
- the nanostructured metal oxide is selected among zinc, titanium, tin, zirconium, tantalum, niobium or molybdenum, iridium, nickel or yttrium oxide
- it comprises a second bifunctional coupling agent carrying a first function and forming a bond with the nanoparticle linked with the NSMO, and a second function forming a bond with another nanoparticle.
- it comprises from two to thirty layers of nanoparticles sandwiched by coupling agents; the nature of the nanoparticles may vary between the various deposited layers.

The method according to the invention advantageously comprises two steps, first functionalizing a nanostructured metal oxide (NSMO) substrate by the bifunctional coupling agent, then grafting nanoparticles (NPs) on the functionalized nanostructured metal oxide (NSMO) obtained in the previous step.

Nanoparticle means a nano-object as defined by the ISO TS/27687 standard, the three dimensions of which are in the nanoscale.

Nanoparticles may be nanocrystals.

A nanostructured oxide is an oxide the surface condition of which comprises a relief with a size of less than 1 micrometer.

Nanostructured metal oxide substrate means a material intended for receiving various components and in particular nanoparticles. The nanostructured metal oxide substrate may be for example a rough surface, a surface supporting nanoparticles or metal oxide nanowires, or a nanoporous layer. The substrate may cooperate with a support (for example made of silicon or glass or other materials differing or not from the metal oxide used for the nanostructure proper).

The bifunctional coupling agent comprises a first function which is a phosphonic function (—P(0)(OH)2). The phosphonic function of the bifunctional coupling agent is intended to form a bond with the nanostructured metal oxide. The bond may be a covalent, hydrogen, ionic or co-ordination bond.

The bond formed between the phosphonic function and the nanostructured metal oxide is one of the strongest among all the functions of the prior art. The phosphonic function has a bi- or tri-dentate grafting mode. As the bond is stable, the density of the coupling agent on the nanostructured metal oxide is high and the grafting of nanoparticles is also dense and uniform.

The step of functionalizing is carried out at temperatures between 10° C. and 80° C., more specifically between 15° C. and 50° C., more specifically between 18° C. and 30° C., preferably at room temperature or 25° C. in an atmospheric pressure. The nanostructured metal oxide may advantageously be functionalized without requiring high temperatures which damage the nanostructured metal oxide.

According to the invention, functionalizing the nanostructured metal oxide is quick. Preferably, the step of functionalizing lasts from 10 seconds to 24 hours, more particularly from 1 minute to 6 hours, preferably 1 hour.

The two stages of functionalizing and grafting are preferably wet operations.

Wet operations means soaking in a solution, spin or spray deposition or any other method wherein the bifunctional coupling agent and the nanoparticles are solubilised in a liquid. Functionalizing the NSMO may also be carried out by contacting it with a vapor phase containing the bifunctional coupling agent.

The method according to the invention requires no complex installations or conditions.

For example, the nanostructured metal oxide is immersed in a solution containing the bifunctional coupling agent.

The bifunctional coupling agent may be in an aqueous or organic medium. Preferably, the coupling agent is in solution in ethanol, dimethylsulfoxide or water so as to enhance its solubility and reaction with the surface of the NSMO.

According to one embodiment, the step of functionalizing the NSMO is preceded by rinsing the nanostructured metal oxide, preferably with water followed by ethanol and drying preferably in argon flow. This allows to remove contaminant if any and to control the oxidation of NSMO.

The nanostructured metal oxide is then preferably exposed to UV in ozone, for example, for ten minutes, in order to remove the residual organic contaminants.

In a preferred embodiment, the step of functionalizing is followed by rinsing, for example with ethanol and drying in argon flow, so as to eliminate the bifunctional coupling agents which are not bound to the nanostructured metal oxide.

The nanostructured metal oxide is preferably selected from zinc, titanium, zirconium, aluminum, tin, silicon, tantalum, niobium, molybdenum, iridium, nickel, of yttrium oxide.

The bifunctional coupling agent is so configured as to bind to the nanostructured metal oxide through a first function and to the nanoparticles (NPs) through a second function.

The linking with the NSMO is via a phosphonic function (—P(O)(OH)2).

Linking with the NPs is via the second function, selected according to the nature of the NPs, and more particularly selected among phosphinic acid, phosphonic acid, phosphine, phosphine oxide, carboxylic acid, amine, imidazole, pyridine, thiol, dithiol, carbodithioate, dithiocarbamate, xanthate, sulfonate, sulfate, selenate or selenoate. Preferably, the coupling agent comprises a spacer. The spacer is positioned between the first function and the second function.

According to one possible embodiment, the spacer comprises a linear or branched saturated or unsaturated carbon chain, aliphatic by nature or aromatic by nature having 2 to 36 carbon atoms, in both cases the spacer may contain heteroatoms such as for example oxygen, sulphur or nitrogen;

The spacer is so configured as to allow an electronic coupling between the NPs and the nanostructured metal oxide. The electronic coupling influences the charge transfer between the NPs and the NSMO. This transfer must be very effective for the proper functioning of devices such as solar cells or photodetectors. It depends on the distance between the NPs and the NSMOs and therefore on the length of the spacer as well as on the chemical nature thereof (aliphatic or aromatic).

Preferably, the bifunctional coupling agent is selected from:

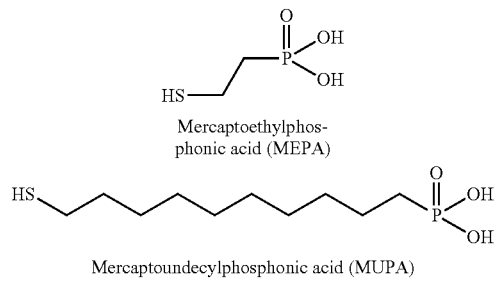

Mercaptoethylphosphonic acid (MEPA)

Mercaptoundecylphosphonic acid (MUPA)

According to the invention, the nanoparticles are advantageously synthesized in an independent step of this deposition method.

The NPs thus have a better controlled surface condition, size and a uniform size distribution.

For example, the nanoparticles are nanoparticles of Copper-Indium-Selenium-(CISe) or Copper-Gallium-Indium-Selenium (CIGSe) or Copper-Indium-Sulphur (CIS) or Copper-Zinc-Indium-Sulphur (CZIS) or Copper-Iron-Sulphur (CFS) or Copper-Zinc-Tin-Selenium (CZTSe) or Copper-Zinc-Tin-Sulphur (CZTS) or cadmium-selenium (CdSe) and cadmium-sulphur (CdS) or cadmium-telluride (CdTe) or indium-phosphorus (InP) or Indium-Arsene (InAs) or Indium-Antimony (InSb) or the alloys thereof. The nanoparticles may have a homogeneous structure or a composition gradient. They may be coated with one or more inorganic shells, for instance CdSe/CdS, CuInS2/ZnS, InP/ZnS.

The step of grafting the NPs makes it possible to bind the NPs to the second function of the bifunctional coupling agent linked to the NSMO. The step of grafting for example comprises soaking the NSMO functionalised by the bifunctional coupling agent in a solution containing the NPs.

The step of grafting is carried out at temperatures between 10° C. and 80° C., more specifically between 15° C. and 40° C., more specifically between 18° C. and 30° C., preferably at room temperature or 25° C. in an atmospheric pressure.

For example, soaking the functionalized NSMO lasts from 1 minute to 72 hours, more preferably from 1 hour to 48 hours, preferably 12 hours After the step of grafting, the functionalized NSMO coated with NPs is preferably rinsed, for example with chloroform and dried, for example in argon flow.

According to an alternative embodiment, the method comprises a step following the step of grafting the NPs enabling the formation of other layers or coats of NPs. It may be preferred to provide a second or even a third layer of NPs on the NSMO, for instance, in order to increase the light absorption in a solar cell type application.

According to the invention, the NSMO comprises from one to thirty layers of NPs, and the nature of the nanoparticles may vary between the various deposited layers.

For this purpose, the method according to the invention comprises a step of functionalizing the NSMO covered with the first layer of NPs. This first step comprises a step of bonding a second bifunctional coupling agent on the NPs linked with the NSMO. This second bifunctional coupling is intended to link with both functions of the NPs, preferably located on layers of separate rows. If the NPs are identical, both functions are advantageously identical. Dithiols may be mentioned as an example: 1,2-ethanedithiol, 1,4-benzenedithiol, or diamines such as 1,4-phenylenediamine. Conversely, if the NPs are different, the two functions will be different in order to better adapt to the NPs which they must bind with.

The second bifunctional coupling agent comprises a spacer between these two functions. The spacer may or may not be identical with that of the first coupling agent linking the NSMO and the first layer of NPs.

After the step of functionalizing, a step of grafting enables the forming of bonds between the second bifunctional coupling agent and the NPs to be grafted.

These steps of functionalizing and grafting advantageously have the characteristics of the steps functionalizing and grafting between the NSMO and the NPs of the first layer of NPs.

The invention also relates to a stack comprising a nanostructured metal oxide substrate covered with nanoparticles by way of a bifunctional coupling agent carrying a first function, this first function being a phosphonic function and forming a bond with the NSMO, and a second function that is intended to form a bond with NPs to be grafting.

Such a stack comprising a NSMO functionalized and grafted with NPs can be used for producing solar cells of the QDSSC (quantum dot sensitized solar cell) type or the ETA-SC (extremely thin absorb solar cell) type. In these cases, a semiconductor of the p-type, e.g. copper thiocyanate, spiro-OMeTAD, PEDOT:PSS, is deposited on the substrate, for example a transparent conductive oxide e.g. ITO, Sn02:F, containing the NSMO with the NPs. Then, a metal electrode, for example made of gold, silver, aluminum, is deposited by thermal vacuum evaporation through a mask. A photovoltaic behaviour can be observed when recording the current changes between the metal electrode and the substrate according to the voltage applied in the dark or when illuminated.

EXEMPLARY EMBODIMENTS

Example 1

Synthesis of the Mercaptoethylphosphonic Acid (MEPA) Coupling Agent

The protocol follows that of reference [Foster, E. W.; Kearns, G. J.; Goto, S.; Hutchison, J. E. *Adv. Mater.* 2005, 17, 1542-1545]. In this synthesis the diethyl ester of the (2-tritylsulfanylethyl) phosphonic acid is first prepared by adding diethyl ester of the (2-bromoethyl) phosphonic acid to the triphenylmethanethiol previously deprotonated using sodium hydride (NaH). Then, the group protecting the product of this reaction is removed using triethylsilane and hydrochloric acid (HCl) hydrolysis.

Example 2

Synthesis of the Mercaptoundecylphosphonic Acid (MUPA) Coupling Agent

The protocol follows that of reference [Fiurasek, P.; Reven, L. *Langmuir* 2007, 23, 2857-66]. Diethyl 10-undecylphosphonate is first synthesized from 11-bromo-1-undecene. It is then condensed with thioacetic acid to give 11-(acetylthio) undecylphosphate through an atom reaction. The thiol group is then deprotected with concentrated hydrochloric acid (HCl) followed by acid hydrolysis of the ester.

Example 3

Synthesis of the $CuInS_2$ Nanocrystals

The protocol follows that of reference [Panthani, M. G.; Akhavan, V.; Goodfellow, B.; Schmidtke, J. P.; Dunn, L.; Dodabalapur, A.; Barbara, P. F.; Korgel, B. A. *J. Am. Chem. Soc.* 2008, 2, 16770-16777]. 1 mmol of copper (II) acetylacetonate (Cu(acac)2) and 1 mmol of In(acac)3 are added to 7 mL of dichlorobenzene (DCB) in a 25 mL three-necked flask. In another 25 mL three-necked flask 2 mmol of elemental sulphur are dissolved in 3 mL of DCB. The two flasks are purged of oxygen and water in low vacuum at room temperature for 30 min, which is followed by N2 bubbling at 60° C. for 30 min. 1 mL of oleylamine is added to the mixture and the two balloons are heated to 110° C. and combined in a N2 flow. The mixture is refluxed (−182° C.) for 1 hr still in a N2 flow. The reaction is cooled to room temperature. The nanocrystals are separated by adding excess ethanol and centrifuging.

Nanocrystals of the CuInS2 composition and having a diameter of 15-20 nm are obtained. They are soluble in non-polar solvents and their surface is covered with oleylamine.

Example 4

Example 4 Production of ZnO Nanowires

The depositions of zinc oxide (ZnO) (2D layers or nanowires) are prepared by electrodeposition on a glass/Sn02:F substrate (10 Ω/sq). The substrates are cleaned in an ultrasonic bath for 15 minutes in trichlorethylene, for 15 minutes in acetone, for 15 minutes in isopropanol, and rinsed, between each step, with hot deionized water. The deposition is carried out in an electrochemical cell provided with three electrodes, with a platinum wire used as a counter-electrode and a saturated calomel electrode (SCE) used as a reference electrode. The electrolyte is an aqueous solution of 5 mM of ZnCl2 and 0.1M of KCl for the 2D layers and $5.10^{-4}M$ of ZnCl2 and 0.1 or 1M of KCl for the nanowires. All the experiments are carried out using saturated electrolytes prior to electroplating using molecular oxygen for one hour in a strong bubbling. The bath temperature is 50 to 70° C. for 2D layers and 80° C. for the nanowires. Zinc oxide is potentiostatically deposited under −1.0V vs ECS. The load density is set at 0.4 C/cm$^2$ for the ZnO 2D layers and 10 C/cm$^2$ for the ZnO nanowires. The bath volume is 200 ml and the solution should be changed after two depositions.

Example 5

Functionalizing of a ZnO Substrate Using MEPA or MUPA

The zinc oxide (ZnO) substrates (2D layers or nanowires) are cleaned by rinsing with water and then ethanol (EtOH). Then they are dried in argon (Ar) and exposed to UV in ozone ($O_3$) for 10 min. Immediately afterwards they are soaked in the 1 mM solutions of MEPA or MUPA acids in ethanol for 1 hr. Upon completion of soaking, the substrates are rinsed again with fresh ethanol and dried in argon.

Example 6

Deposition of NPs onto the Functionalized ZnO Substrate

The functionalized zinc oxide (ZnO) substrates are immersed into the concentrated solution of $CuInS_2$ NPs in chloroform for 12 hr. Then they are washed with fresh chloroform and dried in argon.

Example 7

Production of a Solar Cell

On a glass/SnO2:F substrate containing the ZnO nanowires with 3 layers of functionalized $CuInS_2$ nanoparticles using the MUPA coupling agent for the first layer and the EDT for the following layers, 100 μl of a saturated solution of CuSCN in di-n-propylsulfide are homogeneously spread by heating the substrate to 90° C. In the following a 100 nm thick layer of gold is deposited in a vacuum through a mask. Then the characteristics of the solar cell are recorded by measuring the evolution of the current between the gold electrode and the ZnO substrate according to the voltage applied in the dark or when illuminated.

The characteristics of the above examples may be taken alone or combined with each other without prejudice to the scope of protection.

According to the invention, using X-ray photoelectron spectroscopy or XPS makes it possible to confirm the completion of the step of functionalizing the surface of NSMO by the coupling agent (FIG. 1) and the grafting of the NPs (FIG. 2).

The table below shows the contact angles obtained by measuring the angles of the water drops deposited on a plane surface of zinc oxide (ZnO) functionalized with MEPA and with MUPA. The increase in the angle is due to the more hydrophobic nature of the functionalized surfaces which confirms the presence of the coupling agent.

|  | ZnO | ZnO/MEPA | ZnO/MUPA |
|---|---|---|---|
| Contact angle | 55° | 75° | 72° |

Figure 1A:
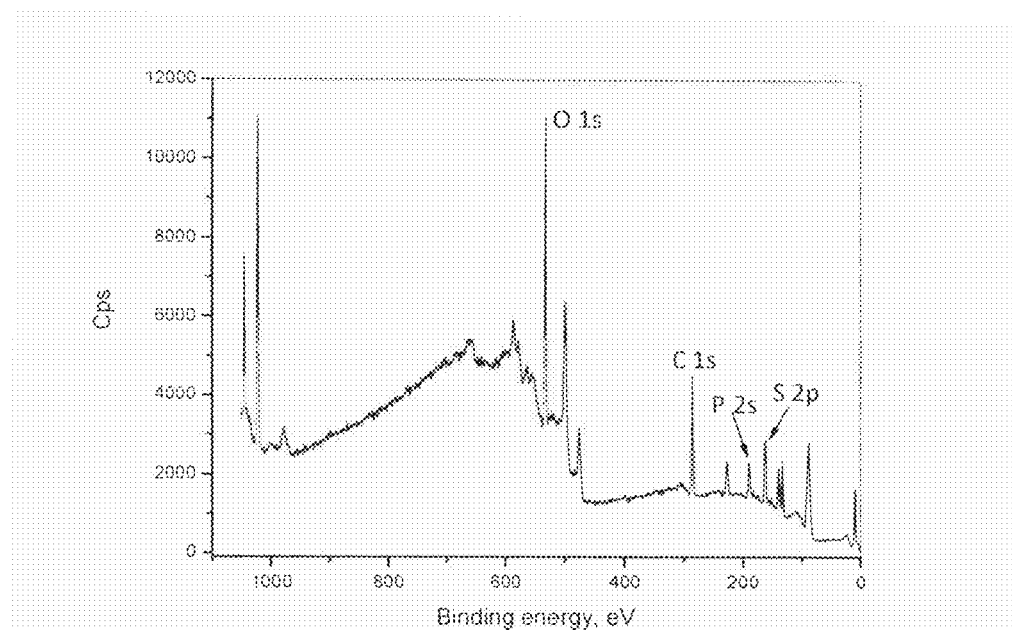
In FIG. 1a, an X-ray photoelectron spectrometry spectrum of zinc oxide (ZnO) nanowires with mercaptoethylphosphonic acid (MEPA) makes it possible to confirm the presence of MEPA on the NSMO by identifying peaks (P and S) corresponding to the components characteristics of the NSMO and MEPA.
Figure 1B:
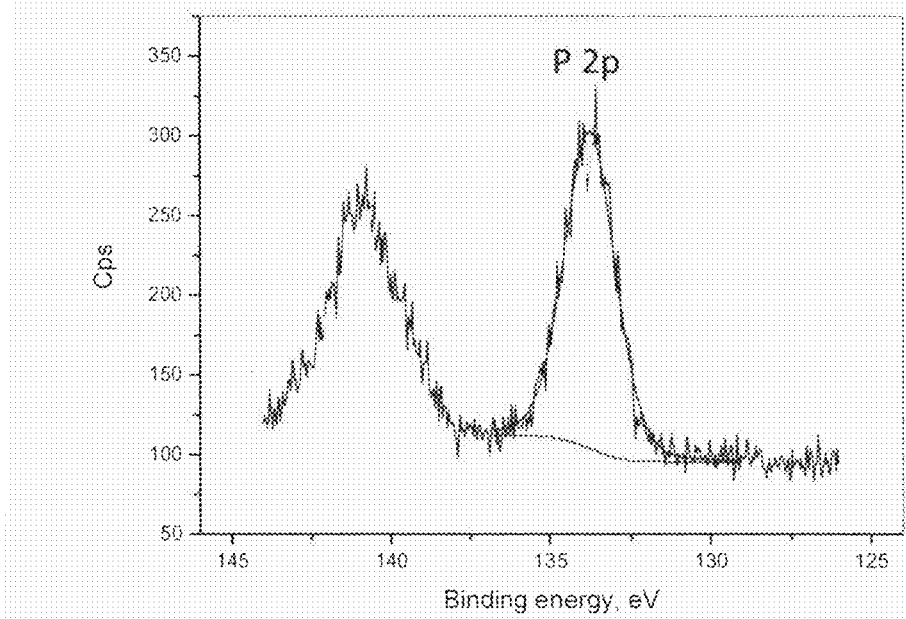
FIGS. 1b and 1c show the results of the X-ray photoelectron spectroscopy measurements. In the high resolution spectra the peaks corresponding to the phosphorus and sulphur atoms characteristics of MEPA can be differentiated.
Figure 1C:
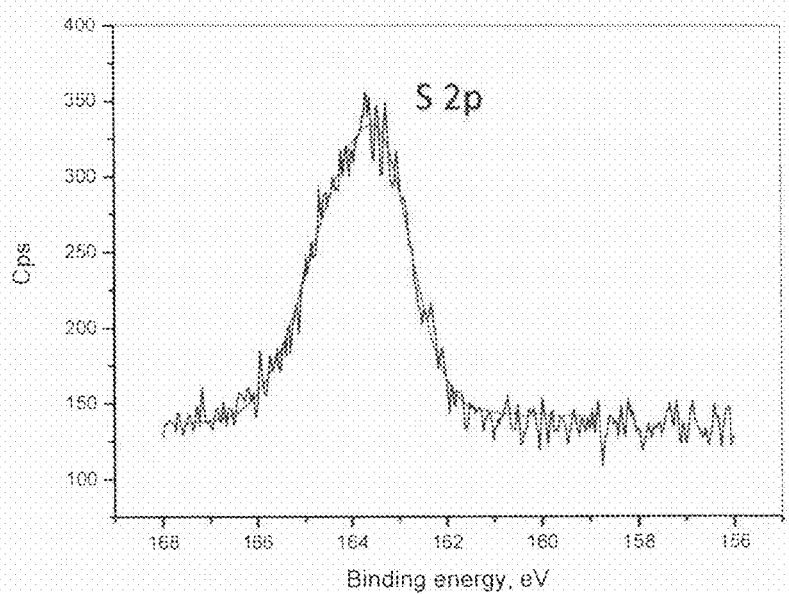
Figure 2:
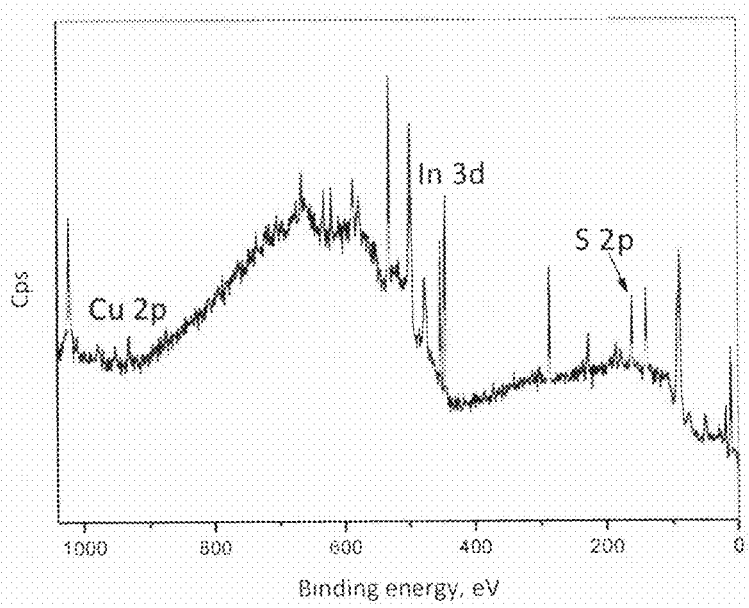
FIG. 2 shows an X-ray photoelectron spectroscopy spectrum of the zinc oxide (ZnO) nanowires functionalized with MEPA and grafted with $CuInS_2$ nanocrystals. The presence of peaks of Cu (Cu2p), In (in3D) and S (S2p) corresponding to the components of the stack confirms the deposition of the nanocrystals.
Figure 3:
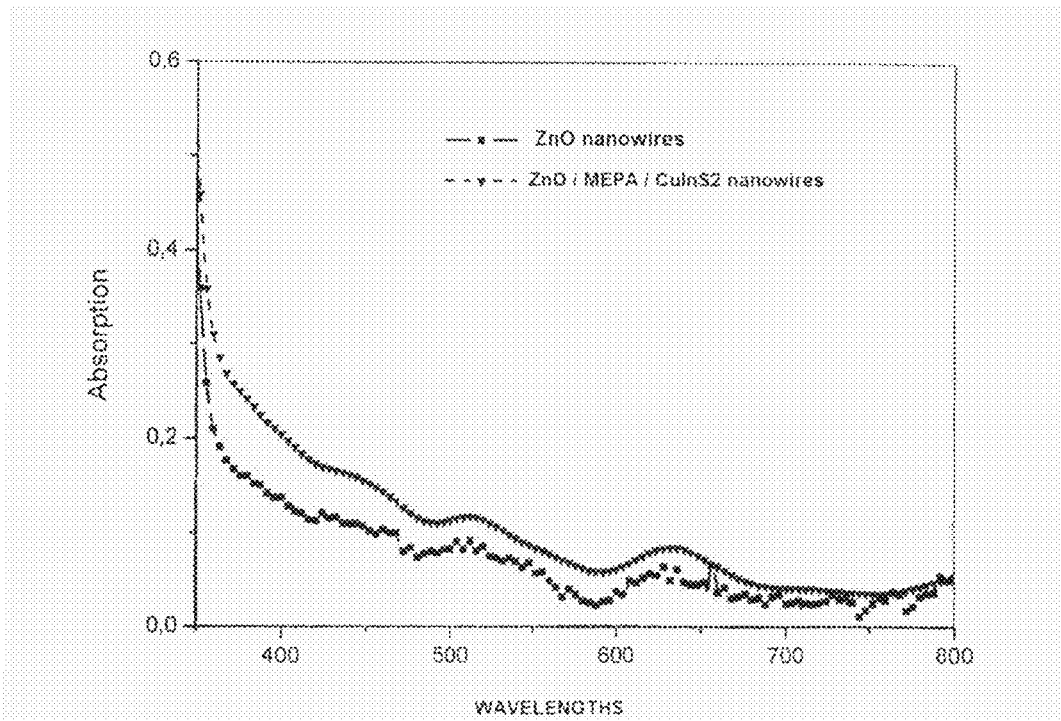

FIG. 3 shows the visible ultraviolet absorption spectra recorded for a substrate of ZnO nanowires prior to, and after the functionalizing of the NSMO and the grafting of CuInS2 NCx. The observed increase in absorption for wavelengths greater than 375 nm confirms the presence of absorbent NCx.

Figure 4:
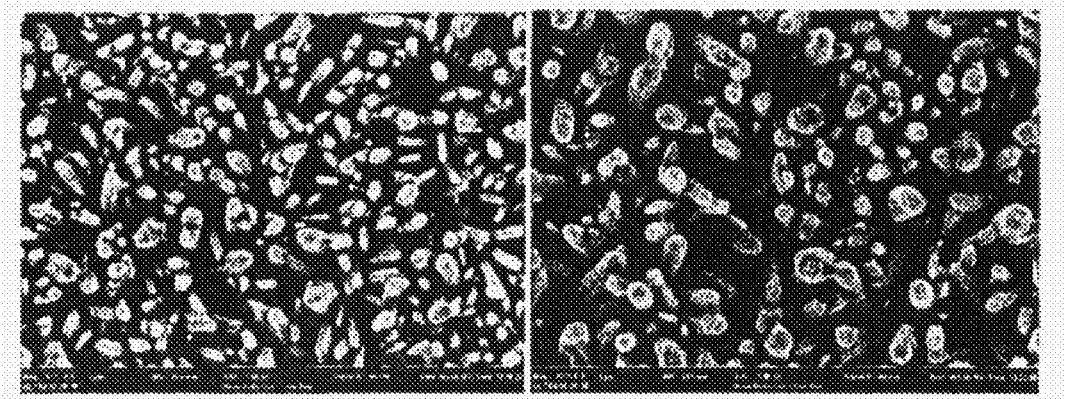

FIG. 4 shows scanning electron microscopy (SEM) images recorded for a substrate of ZnO nanowires with deposited CuInS2 NCx without (left) and with (right) the functionalizing of the NSMO with the MUPA coupling agent. The images confirm the presence of nanocrystals on ZnO. The much more homogeneous deposition on functionalized ZnO confirms the importance of using MUPA.

Figure 5:
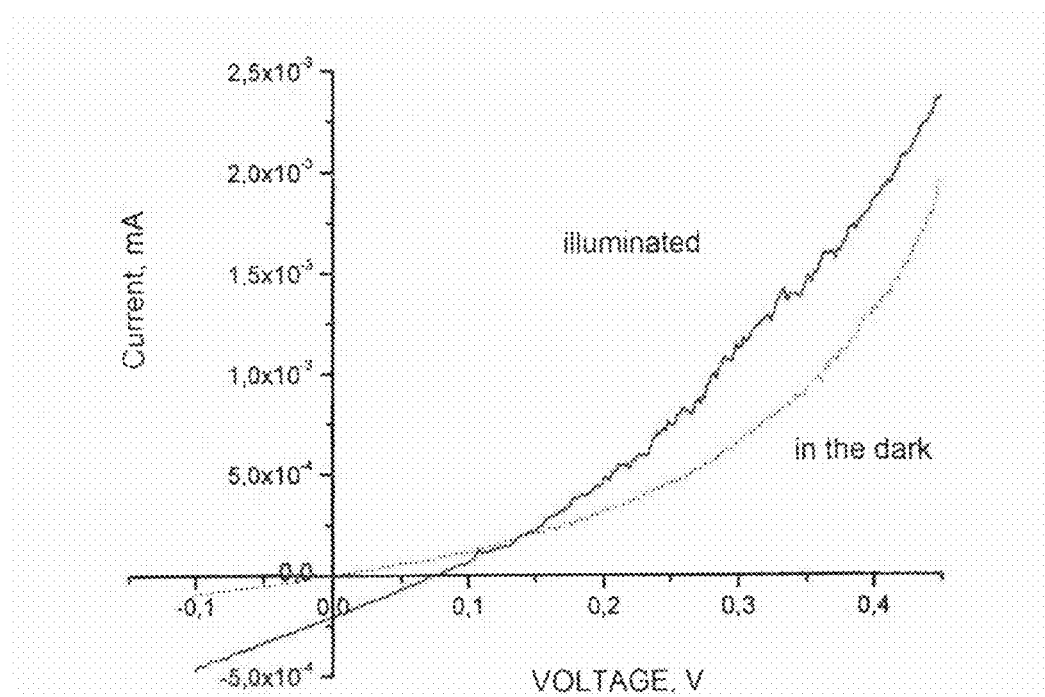

FIG. 5 shows the current-voltage characteristics for a ZnO/spiro-OMeTAD/Au nanowires-based cell, in the dark and when illuminated. The curves show a photovoltaic effect due to the photo-current measured at V=0 when illuminated with 1000 W/m².

Figure 6:
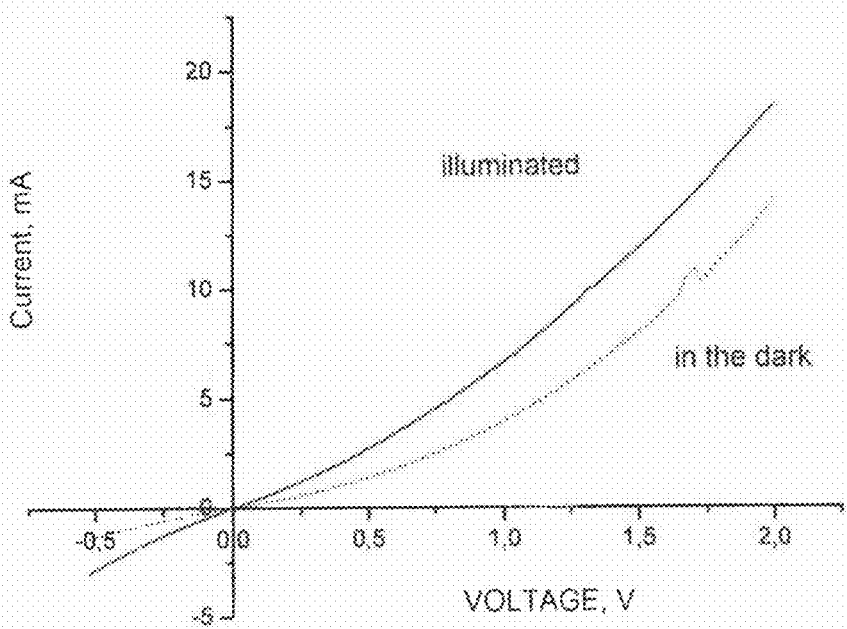

FIG. 6 shows the current-voltage characteristics for a ZnO/spiro-OMeTAD/Au nanowires-based cell, i.e. without using nanocrystals in the dark and when illuminated. The absence of a photo-current at V=0 when illuminated shows that there is no photovoltaic effect in this case.

The invention claimed is:

1. A method for depositing nanoparticles (NPs) on a nanostructured metal oxide (NSMO) substrate of zinc oxide, the method comprising:
   a) functionalising the NSMO substrate with a bifunctional coupling agent carrying a first function that forms a bond with the NSMO, and a second function that will form a bond with a nanoparticle; and
   b) grafting the nanoparticles via a bond with the second function of the coupling agent,
   wherein a phosphonic function is the first function.

2. The method according to claim 1, wherein a) and b) are wet operations.

3. The method according to claim 1, wherein the NPs are synthesized independently.

4. The method according to claim 1, wherein a) comprises soaking the NSMO in a solution of a bifunctional coupling agent.

5. The method according to claim 4, wherein the soaking of NSMO lasts from 1 minute to 6 hours.

6. The method according to claim 4, wherein soaking is preceded and followed by rinsing with a solvent and drying.

7. The method according to claim 1, wherein b) comprises soaking the functionalized NSMO obtained in a) in a solution of nanoparticles.

8. The method according to claim 7, wherein soaking the functionalized NSMO lasts from 1 to 72 hours.

9. The method according to claim 7, wherein soaking the functionalized NSMO is followed by rinsing with a solvent and drying.

10. The method according to claim 1, wherein a) and b) are carried out at a temperature between 10° C. and 80° C.

11. The method according to claim 1, wherein in a), the bifunctional coupling agent is in solution in ethanol or dimethylsulfoxide or water.

12. The method according to claim 1, wherein in b) the NPs are in solution in chloroform, toluene, hexane or heptane.

13. The method according to claim 1, wherein the coupling agent comprises a spacer between the first function and the second function.

14. The method according to claim 13, wherein the spacer comprises a linear or branched, saturated or unsaturated carbon chain, wherein said carbon chain is aliphatic or aromatic comprising from 2 to 36 carbon atoms.

15. The method according to claim 1, wherein the coupling agent is mercaptoethylphosphonic acid (MEPA) or mercaptoundecylphosphonic acid (MUPA).

16. The method according to claim 1, wherein the nanoparticles are binary, ternary or multinary systems.

17. The method according to claim 1, wherein the nanoparticles are of the core/shell type.

18. The method according to claim 1, wherein the second function is selected from the group consisting of phosphinic acid, phosphonic acid, phosphine, phosphine oxide, carboxylic acid, amine, imidazole, pyridine, thiol, dithiol, carbodithioate, dithiocarbamate, xanthate, sulfonate, sulfate, selenoate and selenate function.

19. The method according to claim 1, further comprising after b):
functionalizing the NPs grafted with the NSMO with a second bifunctional coupling agent, wherein said second bifunctional coupling agent forms a bond with the NPs bonded with the NSMO; and
grafting the NPs via a bond with the second coupling agent.

20. The method according to claim 5, wherein soaking is preceded and followed by rinsing with a solvent and drying.

* * * * *